(12) United States Patent
Rossi et al.

(10) Patent No.: US 10,364,147 B2
(45) Date of Patent: Jul. 30, 2019

(54) PROBE CARD FOR A MAGNETICALLY-ACTUABLE DEVICE AND TEST SYSTEM INCLUDING THE PROBE CARD

(71) Applicant: STMicroelectronics S.r.l., Agrate Brianza (IT)

(72) Inventors: Marco Rossi, Usmate Velate (IT); Sergio Mansueto Reina, Motta Visconti (IT); Giacomo Calcaterra, Treviolo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 33 days.

(21) Appl. No.: 15/687,618

(22) Filed: Aug. 28, 2017

(65) Prior Publication Data

US 2018/0237293 A1 Aug. 23, 2018

(30) Foreign Application Priority Data

Feb. 21, 2017 (IT) .......................... 102017000019437

(51) Int. Cl.
*G01R 1/20* (2006.01)
*B81C 99/00* (2010.01)
*G01R 1/067* (2006.01)
*G01R 31/28* (2006.01)
(Continued)

(52) U.S. Cl.
CPC .......... *B81C 99/005* (2013.01); *G01M 11/005* (2013.01); *G01R 1/067* (2013.01); *G01R 1/07307* (2013.01); *G01R 31/2886* (2013.01); *G01R 31/2889* (2013.01)

(58) Field of Classification Search
CPC . G01R 1/20; G01R 1/30; G01R 31/11; G01R 31/40
USPC .............. 324/755.01, 437, 445–446, 754.01, 324/754.03, 754.06, 754.1, 754.11, 324/754.21, 756.03, 690, 715, 724
See application file for complete search history.

(56) References Cited

U.S. PATENT DOCUMENTS 2,688,116 A * 8/1954 Stahl ........................ G01R 1/30
116/298
4,414,507 A 11/1983 Chen
(Continued)

FOREIGN PATENT DOCUMENTS

JP 2011053183 A 3/2011

OTHER PUBLICATIONS

Italian Search Report and Written Opinion for IT 102017000019437 dated Oct. 10, 2017 (6 pages).

*Primary Examiner* — Jermele M Hollington
*Assistant Examiner* — Taqi R Nasir
(74) *Attorney, Agent, or Firm* — Crowe & Dunlevy

(57) ABSTRACT

A probe card fits in a system for testing a micro-electro-mechanical device having an element sensitive to a magnetic field. The probe card is formed by a PCB having a through-opening and probe tips for electrically contacting the micro-electro-mechanical device. A housing structure is received within the through-opening. The housing structure includes a planar peripheral region surrounding seats that protrude and extend at least partly into the through-opening. Magnetic elements are arranged in the seats, with the magnetic elements configured to generate a test magnetic field for testing operation of the micro-electro-mechanical device.

20 Claims, 10 Drawing Sheets

(51) Int. Cl.
*G01M 11/00* (2006.01)
*G01R 1/073* (2006.01)

(56) References Cited

U.S. PATENT DOCUMENTS

| | | | |
|---|---|---|---|
| 6,945,803 B2* | 9/2005 | Potega | G01K 1/02 |
| | | | 439/218 |
| 8,558,554 B2* | 10/2013 | Erdman | G01R 1/0466 |
| | | | 324/537 |
| 2011/0156712 A1 | 6/2011 | Shankar et al. | |
| 2013/0009659 A1* | 1/2013 | Liu | G01R 35/00 |
| | | | 324/756.02 |
| 2013/0222005 A1* | 8/2013 | Hirano | G01R 1/06738 |
| | | | 324/755.01 |
| 2015/0042318 A1 | 2/2015 | Youm et al. | |
| 2015/0070037 A1* | 3/2015 | Pragada | G01R 1/06705 |
| | | | 324/754.03 |
| 2015/0091595 A1* | 4/2015 | Pesl | G01R 31/2601 |
| | | | 324/750.24 |
| 2015/0219689 A1 | 8/2015 | Liu et al. | |
| 2015/0301081 A1* | 10/2015 | Hirano | G01R 1/06755 |
| | | | 324/755.01 |

* cited by examiner

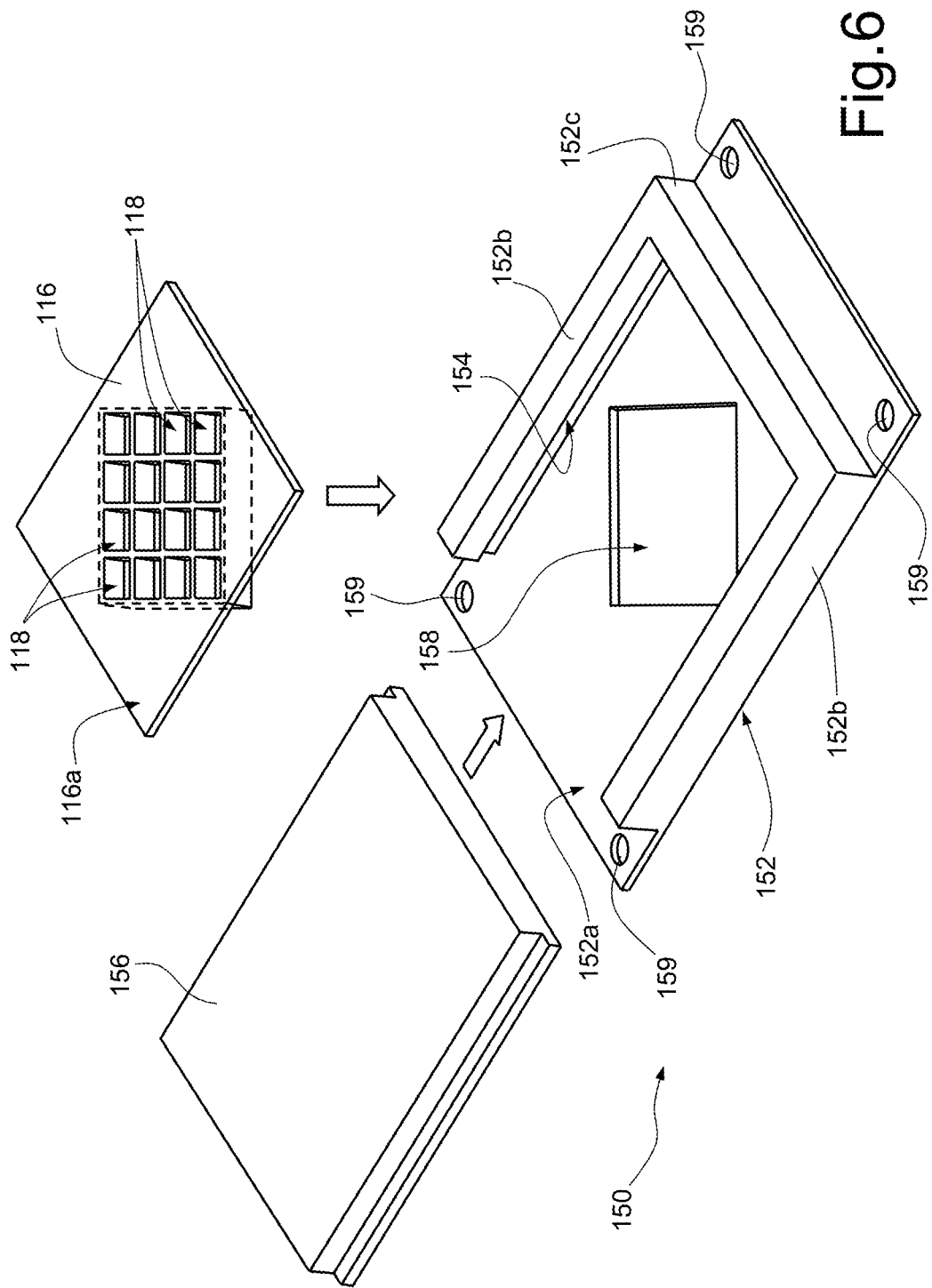

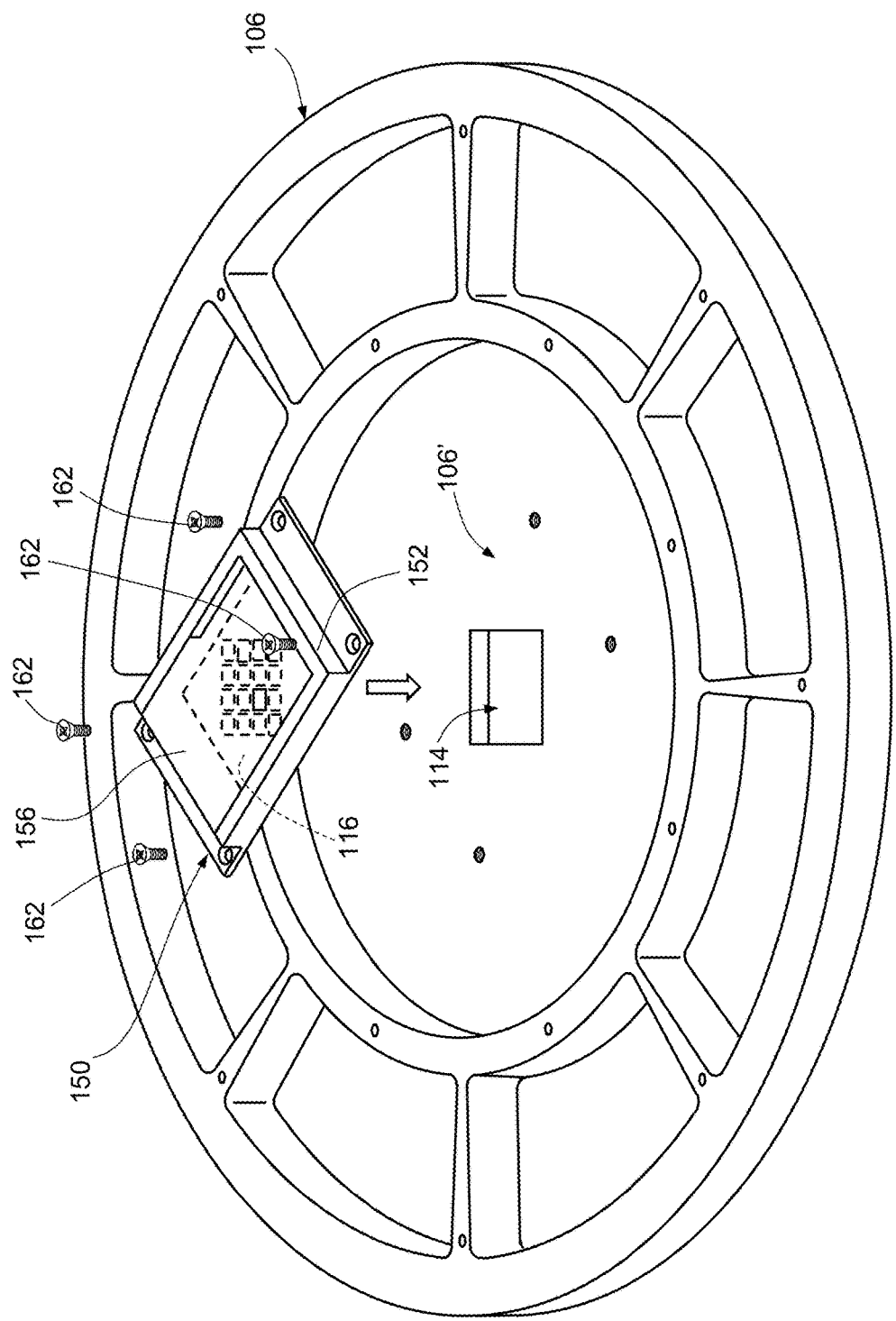

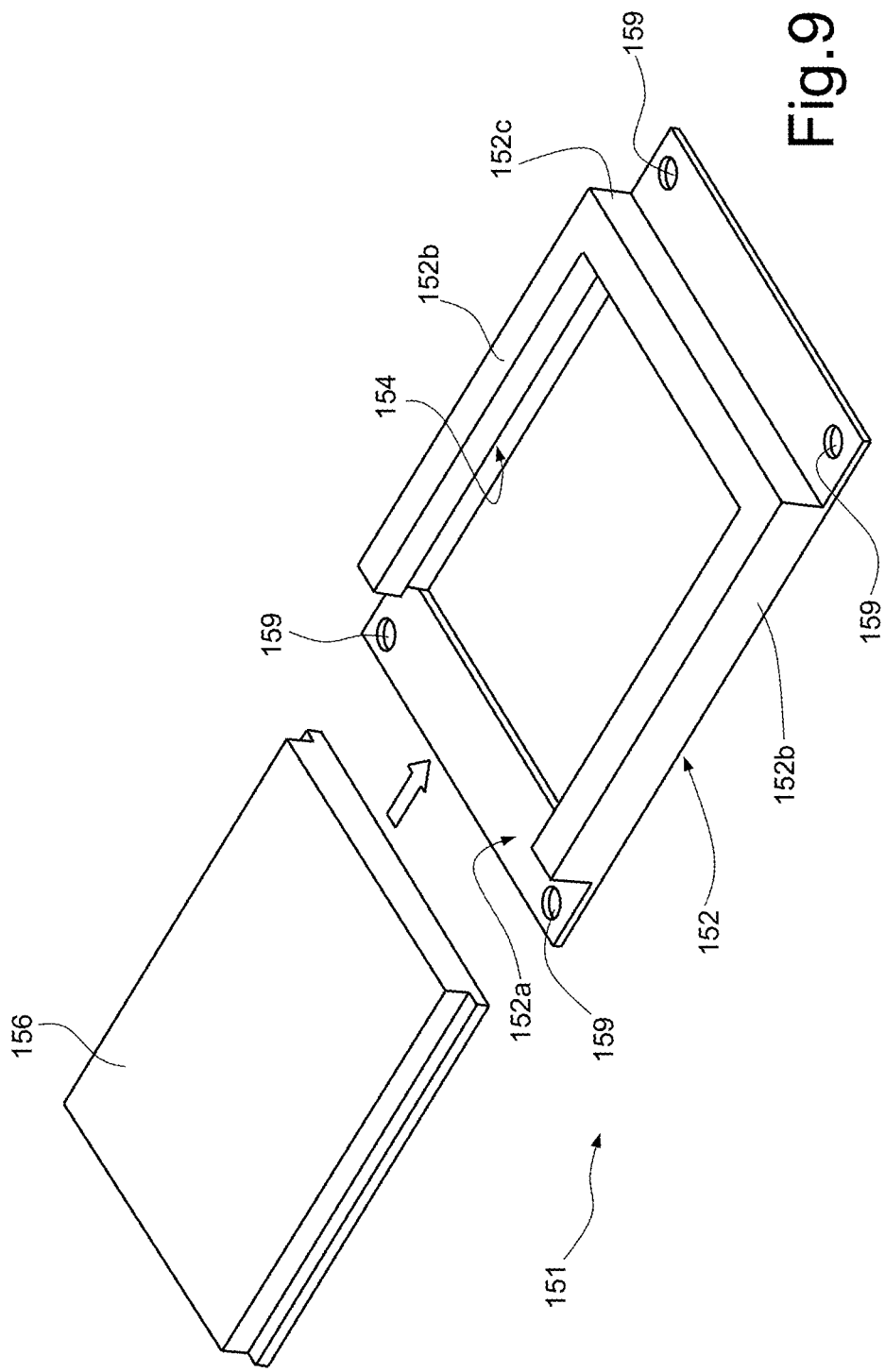

PROBE CARD FOR A MAGNETICALLY-ACTUABLE DEVICE AND TEST SYSTEM INCLUDING THE PROBE CARD

PRIORITY CLAIM

This application claims the priority benefit of Italian Application for Patent No. 102017000019437, filed on Feb. 21, 2017, the disclosure of which is hereby incorporated by reference in its entirety to the maximum extent allowable by law.

TECHNICAL FIELD

The present disclosure relates to a probe card for a magnetically- or electromagnetically-actuable device, in particular a MEMS (Micro-Electro-Mechanical System) device, including a magnetically-actuable oscillating element. The MEMS device can be a micromirror. The present disclosure relates also to a test machine, or system, including the probe card.

BACKGROUND

Micro-mechanical devices having a micromirror structure produced using semiconductor materials technology are known in the art.

Such micro-mechanical devices are used in portable equipment, such as, for example, portable computers, laptops, notebooks (including ultra-thin notebooks), PDAs, tablets, smartphones, and for optical applications, in particular to direct using desired methods light radiation beams generated by a light source.

By virtue of the small dimensions, with such devices strict requirements can be met as regards space occupation in terms of area and depth.

Micromirror devices generally include a mirror element suspended over a cavity and are produced from a body of semiconductor material so as to be movable, for example with roll and pitch movements.

The rotation of the mirror element is controlled by means of an actuation system which, presently, is of the electrostatic, electromagnetic or piezoelectric type.

The need to perform tests on the operation of such MEMS devices is recognized; however, the systems presently known for testing magnetically- or electromagnetically-actuated MEMS devices are limited by electromagnetic interference phenomena between the magnetic field generators used for the test and the electronic circuitry of the test machine (wafer prober and tester). Problems have furthermore been encountered in the fabrication of probe cards that can be used in such systems, due to the difficulty of integrating magnetic field generators within them.

There is accordingly a need in the art for a probe card for a magnetically- or electromagnetically-actuable device, and a test system including the probe card suitable for overcoming the abovementioned difficulties and limits.

SUMMARY

In an embodiment, a probe card adapted to be fitted in a system for testing a magnetically-actuable device comprises: an integrated circuit board having a first through-opening at probe tips of said probe card; a housing structure, including a planar region which surrounds one or more seats protruding from the planar region and extending at least partly through the first through-opening; and one or more magnetic elements arranged in a respective seat of the housing structure, configured to generate a test magnetic field configured to magnetically actuate the device during a test phase of the device.

In an embodiment, a test system comprises: a chuck for supporting a wafer of semiconductor material including a magnetically-actuable device, a probe card as discussed in the preceding paragraph; a wafer prober mechanically coupled to the probe card, configured to move the chuck in order to electrically couple selective portions of said device with respective probe tips of the probe card; and a data processing circuit electrically coupled to the probe card, configured to feed electrical test signals to the device by means of the probe card and to process response signals received, via the probe card, from the device during the magnetic actuation of the device.

BRIEF DESCRIPTION OF THE DRAWINGS

For a better understanding of the present invention, preferred embodiments thereof are now described, purely by way of non-limiting example, with reference to the accompanying drawings in which:

FIG. 6 illustrates a support and containment module for the housing structures shown in FIGS. 5A-5D according to one embodiment of the present disclosure;

FIG. 8 shows an exploded perspective view of a probe card including the support and containment module of FIG. 6;

FIG. 9 illustrates a support and containment module for the housing structures shown in FIGS. 5A-5D according to a further embodiment of the present disclosure.

DETAILED DESCRIPTION

Figure 1:
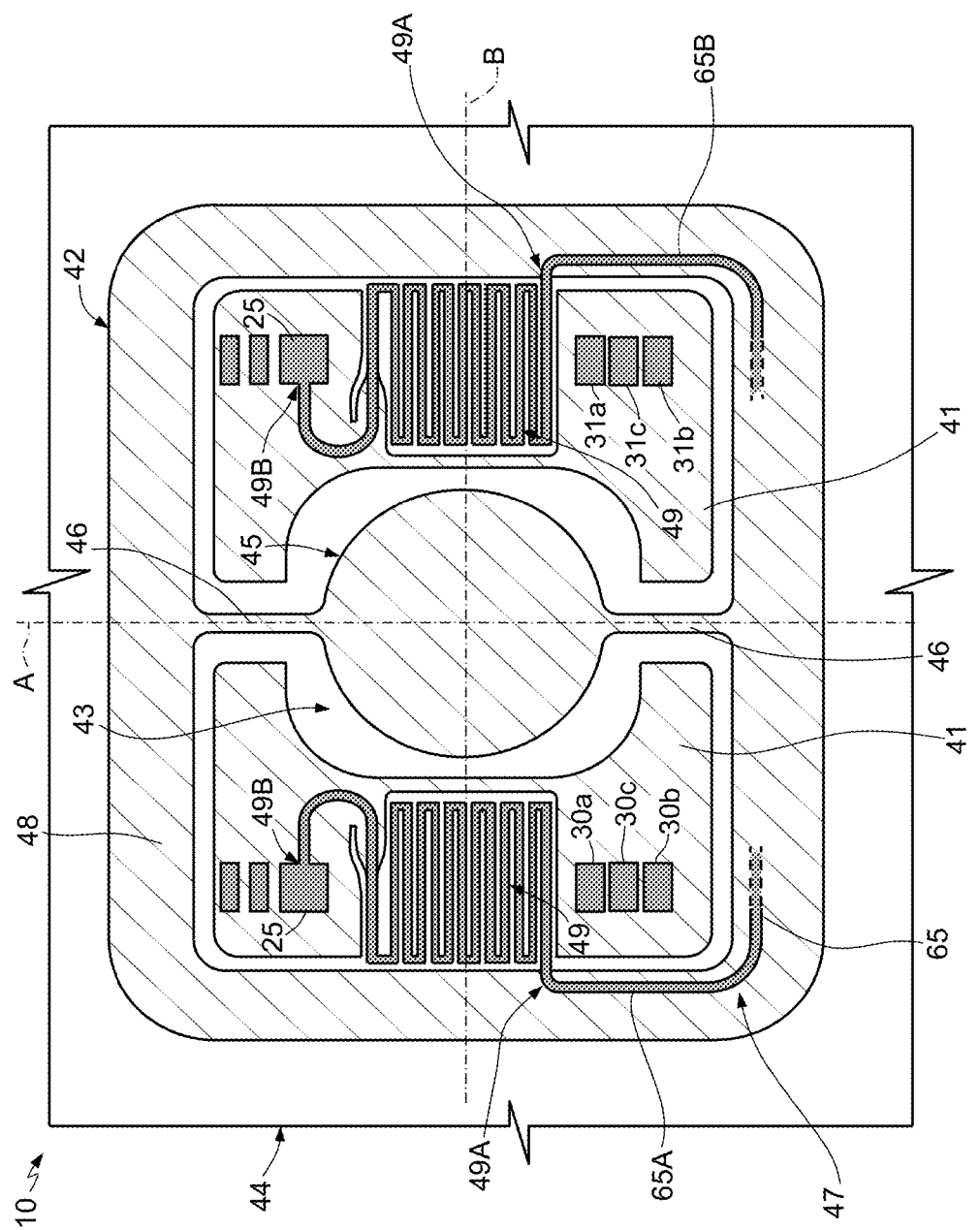
FIG. 1 is a schematic view from above of a MEMS device, in particular a micromirror, with magnetic actuation.

FIG. 1 shows a Micro-Electro-Mechanical System (MEMS) device 10, in this case a micromirror, comprising a fixed structure 41 and a suspended structure 42. The suspended structure 42 extends to the inside of a cavity 43 externally delimited by the fixed structure 41. The fixed structure 41 comprises a substrate (not visible) which extends beneath the cavity 43 and the suspended structure 42. In a manner that is not shown, and common to MEMS structures, the fixed structure 41, the suspended structure 42 and the cavity 43 are obtained from a die 44 of semiconductor material, for example silicon, using known semiconductor processing techniques, such as excavation, growth, deposition and/or selective removal, in a manner that is known per se.

The suspended structure 42 comprises an orientable structure 45 borne, via a first pair of arms or torsion springs 46, by a frame 48, also suspended, which surrounds the orientable structure 45. For its part, the frame 48 is borne by the fixed structure 41 via a second pair of arms or torsion springs 49.

The first arms 46 are of linear shape, they extend along a first axis of rotation A and they are configured so as to allow the orientable structure 45 to rotate about this first axis of rotation A.

The second arms 49 have a winding shape and are configured so as to allow the frame 48 to rotate mainly about a second axis of rotation B.

The second arms 49 each have a first end 49A connected to the frame 48 and a second end 49B anchored to the fixed structure 41 and electrically coupled to a contact pad 25. Both the first ends and the second ends of the second arms 49 are offset with respect to the second axis B. In detail, the first ends 49A of the second arms 49 are arranged at the same first side of the second axis of rotation B and the second ends 49B of the second arms 49 are arranged at the same second side of the second axis of rotation B. Furthermore, the second arms 49 are arranged in a balanced manner overall with respect to the same second axis B, such that the center of mass of the suspended structure 42 coincides at least approximately with the intersection point between the first and second axes A, B. The MEMS device 10 is also symmetrical overall with respect to the first axis of rotation A.

In the embodiment shown, the movement of the orientable structure 45 takes place through electromagnetic actuation via an actuation structure 47 comprising a coil 65 (for which only an initial portion 65A and an end portion 65B are illustrated in FIG. 1, for simplicity) and a magnetic structure. In particular, in the example shown, the frame 48 has an annular shape, generally rectangular, defining four sides, parallel in pairs with the axes of rotation A, B. The coil 65 extends above the frame 48, where it forms at least one turn, preferably a plurality of turns, between the initial portion 65A and the end portion 65B. The magnetic structure can be made up of magnetic elements, for example external to the die 44. In particular, the mutual arrangement between the magnetic elements and the die 44 is such as to generate an inclined magnetic field at approximately 45° with respect to the axes A, B so as to enable actuation on both the axes A, B.

Figure 2:
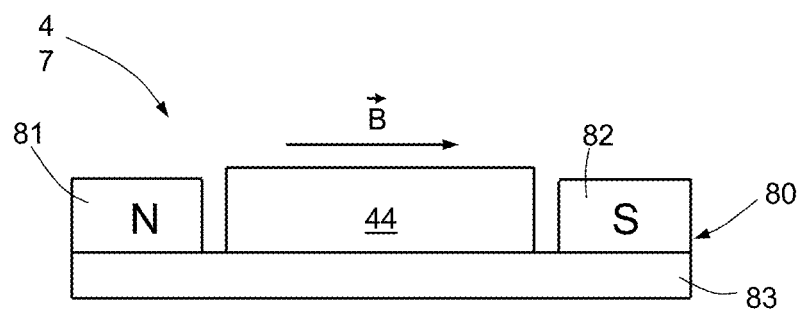
FIGS. 2 and 3 are, respectively, a view from the side and a view from above of a system including the micromirror device of FIG. 1.
Figure 3:
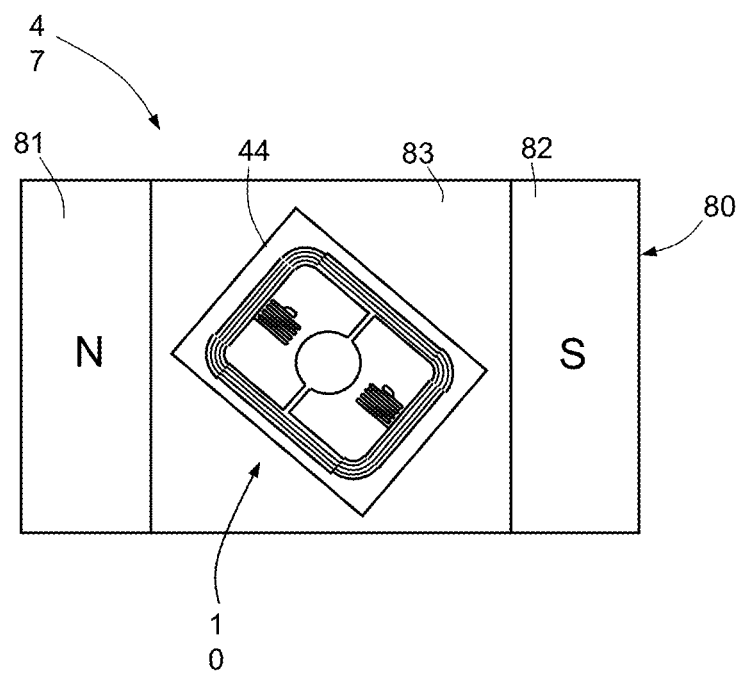

For example, FIGS. 2 and 3 show a possible arrangement in which a magnetic element 80 exhibits a first magnetic pole 81 and a second magnetic pole 82 mutually spaced and held by a support 83, for example of ferromagnetic, or non-magnetic, material. The die 44 of FIG. 1 is held by the same support 83, between the magnetic poles 81, 82 and is arranged at 45° with respect to the direction of the magnetic field B generated by the magnetic element 80, as can be seen in particular in FIG. 3.

With the solution described, by supplying an alternating current at preset frequencies, it is possible to achieve the rotation of the orientable structure about the two axes A, B. In particular, by supplying simultaneously to the coil 65 two currents of suitable amplitude and different frequencies, one of which is close to the resonant frequency, these generate a magnetic field which, through induction, causes the frame 48 to rotate about the second axis B and the orientable structure 45 to rotate about the first axis A.

In detail, by supplying to the coil 65 an alternating current at a first frequency f1 (for example, a low frequency, such as 60 Hz) and a first amplitude (for example 100 mA), this causes the frame 48 to rotate in phase with the orientable structure 45 ("roll" movement) about the second axis of rotation B by the desired value (and at the frequency f1). By supplying at the same time to the coil 65 an alternating current at a second frequency f2, higher than the first and close to the resonant frequency (for example, 20 kHz) and at a second amplitude, for example 100 mA, this current causes a small rotation of the frame 48 about the first axis of rotation A; such a small rotation is amplified through resonance by the orientable structure 45, and also due to the characteristics of the first springs 46, achieving the rotation of the orientable structure 45 about the first axis of rotation A by the desired value and at the frequency f2 ("resonance movement" of the orientable structure 45, also called "pitch" movement of the suspended structure 42).

The rotation of the frame 48 about each axis of rotation A, B is detected and distinguished by means of suitable sensors (e.g. of the piezoresistive type), exploiting the various stresses caused by each rotation on the second arms 49.

In one embodiment, the abovementioned sensors each comprise two piezoresistors coupled to each other to form a respective first and second Wheatstone half-bridge structure. In particular, the two piezoresistors of each half-bridge are arranged at ±45° with respect to the second axis of rotation B. The piezoresistors are, for example, produced as implanted or diffused regions (for example, N-type regions) inside the silicon layer which forms the suspended structure 42 and the top part of the fixed structure 41.

Contact pads 30a and 30b form electrical access points for biasing the first half-bridge, and a contact pad 30c forms a pickup point for the output signal of the first half-bridge (with respect to an earth, or ground, reference, this also being accessible via a respective pad).

Contact pads 31a and 31b form electrical access points for biasing the second half-bridge, and a contact pad 31c forms a pickup point for the output signal of the second half-bridge (with respect to an earth, or ground, reference, this also being accessible via a respective pad).

The roll and pitch movements can be determined by an analysis of the output signals from each half-bridge (which is not an object of the present invention).

The need to carry out steps for testing the MEMS device 10 in order to check its behavior under predetermined operational conditions is recognized. Typically, the tests are performed during intermediate fabrication phases, in particular before the cutting, or "singulation", step of the dies 44. In this case therefore, a plurality of MEMS devices 10 are arranged beside one another on a wafer, making it impractical to use a test configuration which provides for the use of a magnetic element which partially surrounds the MEMS device under test, in a similar manner to that shown in FIGS. 2 and 3 (relating to a configuration that applies during the use of the MEMS device 10).

Figure 4A:
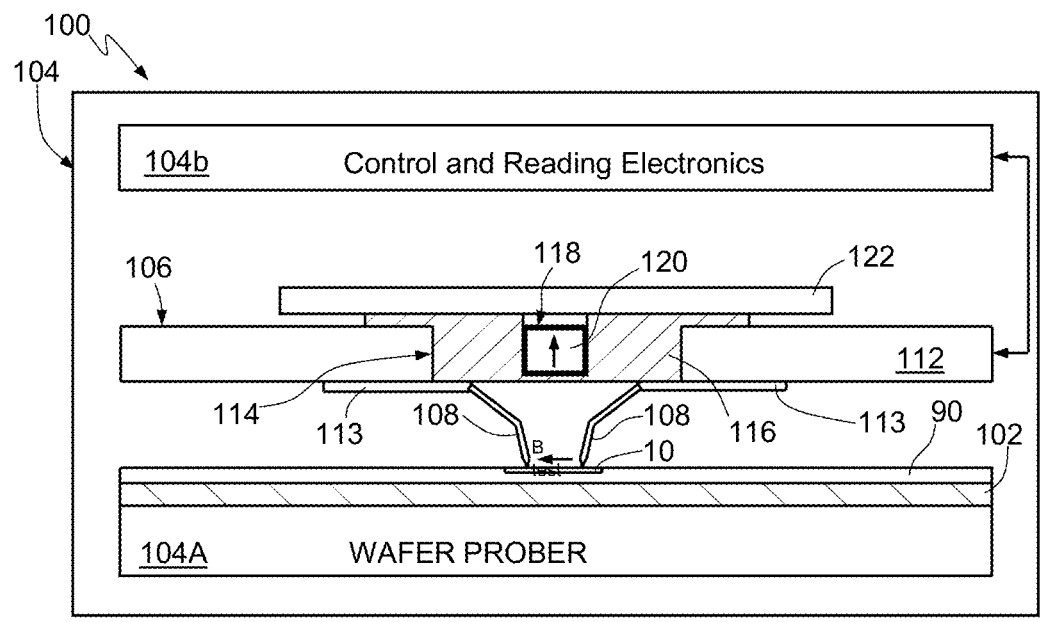
FIGS. 4A and 4B are respective embodiments of a test system of the MEMS device of FIG. 1.

FIG. 4A illustrates, in a schematic cross-sectional view from the side, a system 100 for testing the MEMS device 10 in a wafer 90.

In a per se known manner, the wafer 90 is arranged on a retaining device (known as a "chuck") 102 of a test machine 104 (including a wafer prober 104a, and control and reading electronics 104b, which are illustrated schematically). For the application described here, it is appropriate that the chuck 102 be of a non-magnetic material.

The test machine 104, in particular the wafer prober 104a, implements the loading features of the wafer 90 and its movement features, in order to align the MEMS device 10, which is desired to be tested using test instruments, or a probe card, 106 provided with probe tips 108 suitable for electrically contacting respective conductive pads on the wafer 90. To this end, the test machine 104 is equipped with an automatic alignment system, e.g. of an optical type, configured to align the wafer 90 with sufficient accuracy to ensure the desired electrical coupling between the probe tips 108 and the conductive pads on the wafer 90. The alignment system, of a type that is known per se and not a subject of the present disclosure, is not described here further.

The probe card 106 forms an interface between the test machine 104 and the wafer 90. Typically, the probe card 106 is mechanically coupled to the wafer prober 104a and electrically coupled to the control and reading electronics 104b. The function of the probe card 106 is to provide an electrical route between the test system and the circuitry (contact pads) on the wafer 90. Typically, the probe card 106 includes an integrated circuit board (PCB) 112, which bears probe tips 108 by means of a bearing structure 113.

According to one aspect of the present disclosure, the integrated circuit board 112 has an opening, in particular a through-opening, 114. At least partly in the through-opening 114, there is arranged a housing 116 provided with one or more seats 118 suitable for containing at least one magnetic element 120 suitable for generating a magnetic field $B_{test}$ with field lines, at the MEMS device 10 under test, which are coplanar with the plane in which the coil 65 of the MEMS device 10 under test lies. The magnetic element 120 is, in particular, a permanent magnet with a north pole (outgoing magnetic field) and a south pole (incoming magnetic field).

Thus, at the MEMS device 10 under test, it is possible to simulate the presence of a magnetic field similar to the magnetic field B generated by the magnetic element 80 of FIG. 2. A cover 122 extends above the housing 116 and its purpose is to encourage the magnet 120 to be held in the respective position inside the respective seat 118. The cover 122 is, in one embodiment, made of non-magnetic material or, preferably, of ferromagnetic material suitable for confining the magnetic field $B_{test}$ at the probe card 106. A further layer, of "μ-metal", also known as "mu-metal", i.e. a metal alloy endowed with high magnetic permeability (e.g. a nickel-iron alloy), extends, optionally, above the cover 122, in particular when the latter is of plastic or non-magnetic material.

Alternatively, in a further embodiment, the cover 122 is itself made of a metal alloy endowed with high magnetic permeability (e.g. a nickel-iron alloy), or "μ-metal".

Figure 4B:
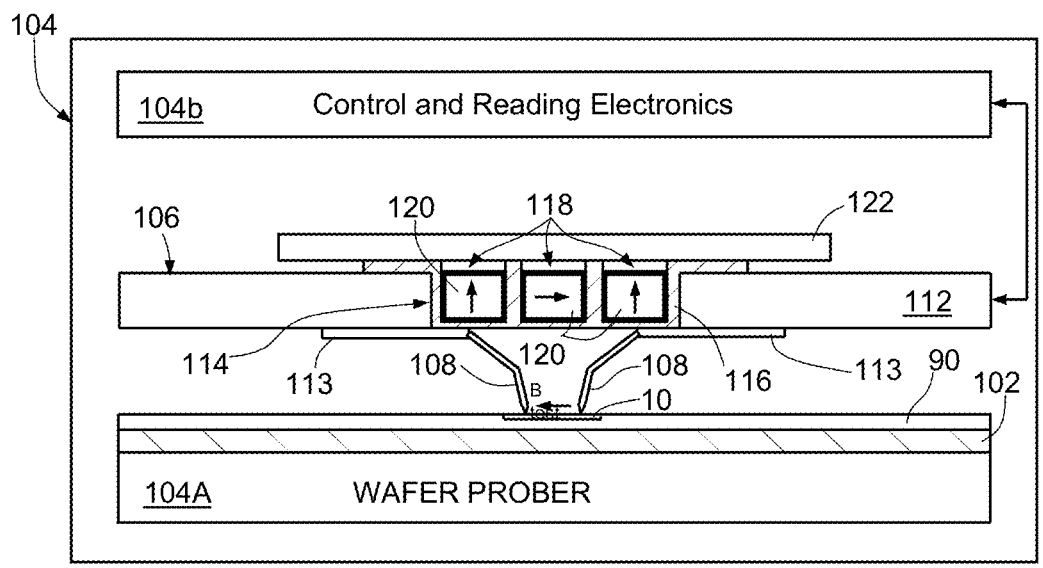

According to an embodiment, illustrated in FIG. 4B, the housing 116 has at least three seats, or housings, 118 in which three respective magnets 120a-120c are inserted; the magnets 120a-120c are mutually arranged according to a Halbach configuration, or in a spatial configuration such that the magnetic field $B_{test}$ has a higher intensity at the MEMS device 10 under test and a lower intensity at the control and reading electronics 104b. Thus, the magnetic field generated by the magnets 120a-120c does not significantly interfere with the circuitry of the control and reading electronics 104b.

The Halbach vectors, or matrices, are known in the prior art, and can include three or more magnets. FIGS. 5A-5D show, in perspective view in a three-axis reference system X, Y, Z, respective housings 116 each including a plurality of seats 118 housing a respective magnet.

As can be observed in the figures, each housing 116 exhibits a frame portion 116a which surrounds the seats 118; the seats 118 protrude, or extend, from the frame portion 116a. The seats 118 of each housing 116 have, taken together, a vector or matrix form.

The magnets, thus organized in vectors/matrices, are oriented so as to form respective Halbach vectors/matrices, in a manner that is known per se. In detail, with reference to FIG. 5A, a vector 124A is formed including a first magnet 120a having its north pole oriented in the positive direction of the Z axis; a second magnet 120b, beside the first magnet 120a, having its north pole oriented in the positive direction of the X axis, orthogonal to the Z axis; and a third magnet, beside the second magnet 120b, having its north pole oriented in the negative direction of the Z axis.

The magnetic field $B_{test}$ thus generated is strengthened along one face 125' (the bottom side in the figure) of the vector 124A and at the same time is cancelled (or rather, is reduced in intensity) through destructive interference at the opposite face 125" (the top side in the figure).

Figure 5A:
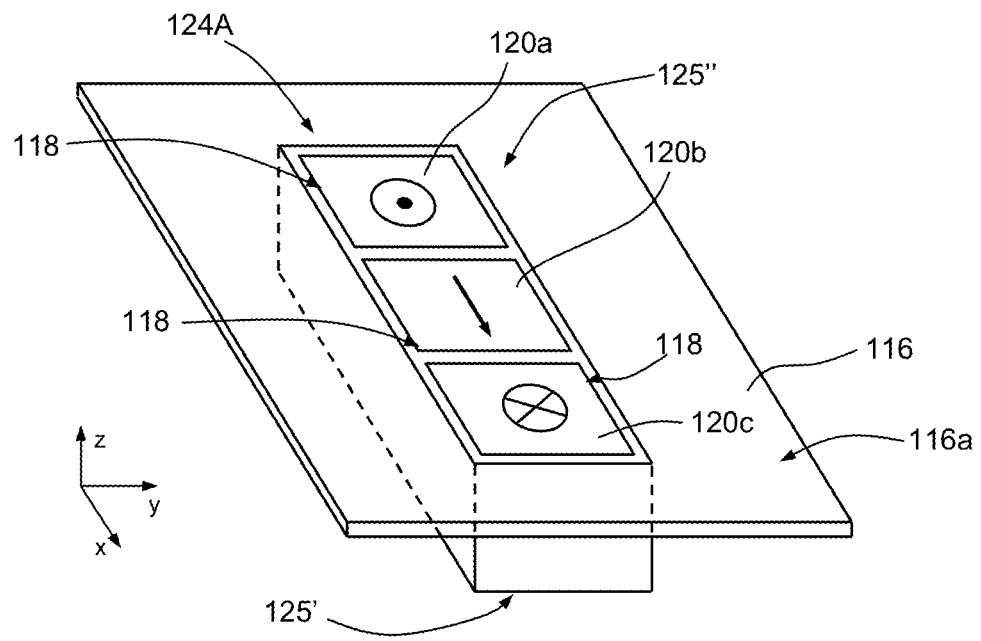
FIGS. 5A-5D illustrate respective structures for housing magnets suitable for generating a test magnetic field and which can be used in the test system of FIG. 4A or FIG. 4B.
Figure 5B:
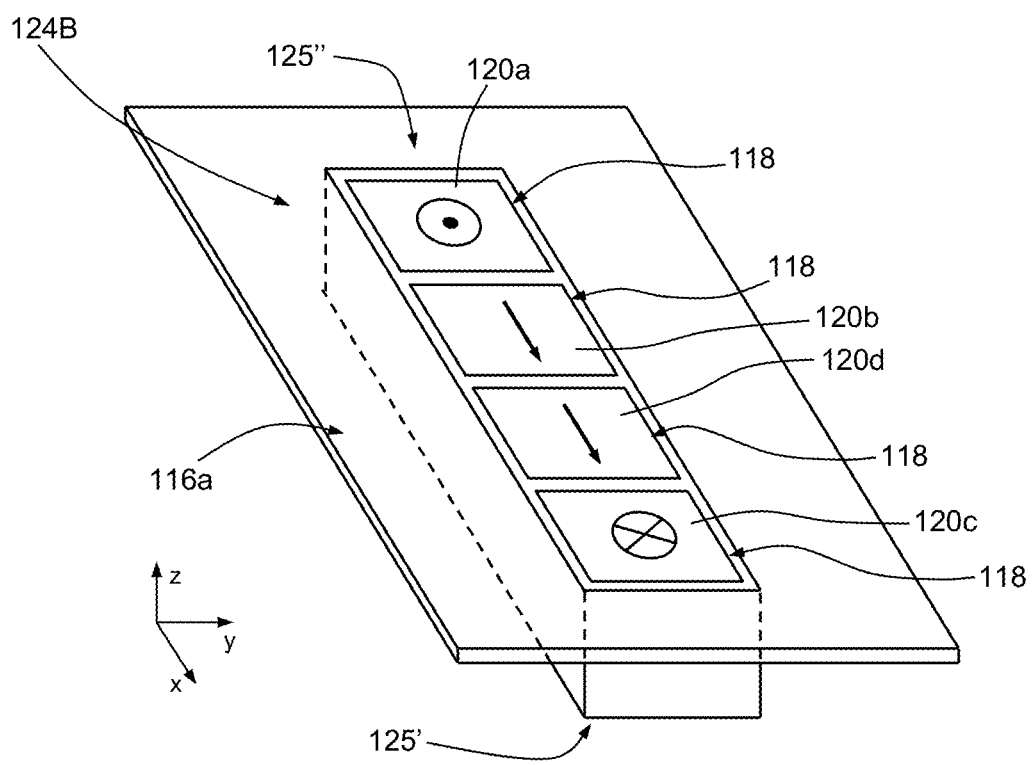

According to a further embodiment, a vector 124B can be formed as shown in FIG. 5B (elements common to those of FIG. 5A are indicated using the same reference numbers) in which four magnets 120a-120d are arranged one beside the other in the X direction. The first magnet 120a is oriented with its north pole in the positive direction of the Z axis (upwards in the figure); the magnet 120c, last in the vector, is oriented with its north pole in the negative direction of the Z axis (downwards in the figure); the magnets 120b, 120d, arranged between the magnet 120a and the magnet 120c, have both their north poles oriented in the positive direction of the X axis, orthogonally to the Z axis.

In general, it is possible to arrange, between the magnet 120a and the magnet 120c, any number of magnets oriented as the magnets 120b and 120d.

Figure 5C:
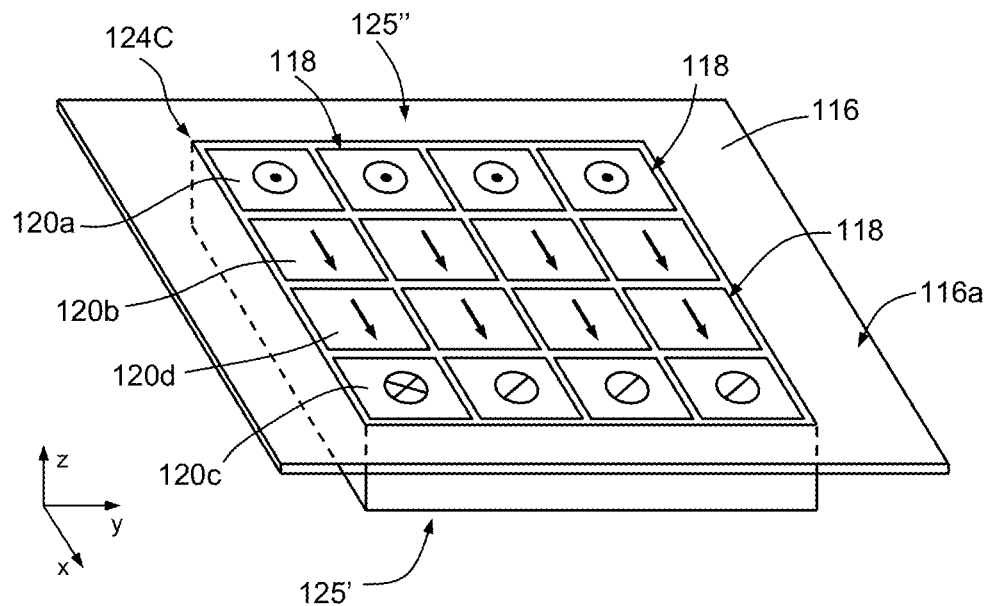

FIG. 5C shows a housing 116 provided with sixteen seats 118 forming a matrix 124C, each seat housing a respective magnet; the seats 118 of the housing 116 are organized as a 4×4 matrix, setting out respective magnets so as to replicate, along the X axis, the configuration illustrated in FIG. 5B.

Figure 5D:
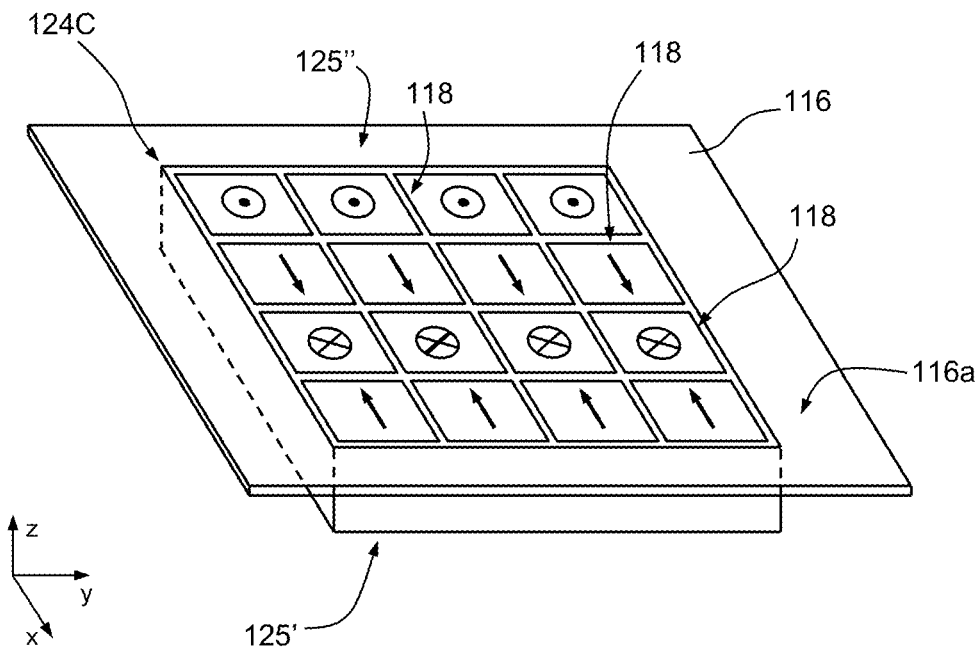

Alternatively, in FIG. 5D, the magnets of the matrix of FIG. 5C can be arranged according to a horseshoe shape configuration, with their polarities alternately inverted.

Other configurations, including a number of seats 118 different from that illustrated in FIGS. 5A, 5D, or a different arrangement of magnets, are possible without thereby departing from the scope of the present disclosure. In particular, as mentioned previously, it is possible to abandon the Halbach configuration by providing for the use of a single magnet 120 (FIG. 4A).

The inventors have verified that arranging the housing 116, provided with at least one magnet 120, inside the through-opening 114 of the PCB 112 or, similarly, arranging the housing 116, inside the through-opening 114 of the PCB 112 and then inserting the at least one magnet 120, is a complex operation which requires precision and is also not practical.

Therefore, according to one aspect of the present disclosure, there is provided a support module for one of the housings 116 described previously (for example, the housings 116 illustrated in FIGS. 4A-4B), or for one of the housings illustrated in FIGS. 5A-5D, according to the respective embodiments.

FIG. 6 illustrates, in exploded view, a support module 150 according to one aspect of the present disclosure, that can be used to support and/or contain the housing 116. To this end, the support module 150 includes a frame structure 152, of quadrangular shape here, in particular rectangular, having a bottom surface 152a, side walls 152b which extend orthogonally to the bottom surface 152a on the sides of the bottom surface 152a that are opposite one another, and another side wall 152c which extends orthogonally to the bottom surface 152a at a third side of the bottom surface 152a, connecting the side walls 152b. Thus, the side walls 152b, 152c surround the bottom surface 152a on three sides. The side walls 152b exhibit a respective track, or guide, 154, in which a slide 156 runs functioning as a cover of the frame structure 152. The guide 154 is formed, in particular, by recesses in the side walls 152b.

The slide 156 is provided with tapered peripheral regions configured to be inserted in the recesses of the guide 154 and to slide in them. Thus, the slide 156 is movable between two extreme positions, i.e. a fully closed position and a fully open position. In the fully closed position, the slide 156 butts against the side wall 152c (end-of-travel position).

The frame structure 152 exhibits a through-opening 158 through the bottom surface 152a, configured to allow the seats 118 of the housing 116 to pass through. The frame portion 116a of the housing 116 forms a bearing region of the housing 116, which thus rests on the bottom surface 152a, laterally with respect to the through-opening 158, while the seats 118 extend through the through-opening 158.

In use, the slide 156 is brought to the fully open position; then the housing 116 is positioned inside the frame structure 152, as described previously; then the magnets are inserted in the respective seats 118; and lastly, the slide 156 is brought into the fully closed position. Thus, the structure of FIG. 7 is obtained. It is noted that inserting magnets 120 and closing the slide 156 can be carried out such that the slide gradually covers the magnets inserted in the seats 118, so as to prevent the magnets already inserted in the seats 118 from coming out therefrom due to mutual repulsion.

The magnets are arranged in a secure position inside the support module 150, which prevents them from coming out. Then, the support module 150 can be mechanically coupled to the probe card 106, in such a way that the seats 118 are inserted inside the through-opening 114 of the integrated circuit board 112. To ensure a reliable coupling between the probe card and the support module 150, it is possible to provide attachment means of various types, such as for example screws, which can be screwed to the PCB through the through-openings 159 provided in the frame structure 152.

Figure 7A:
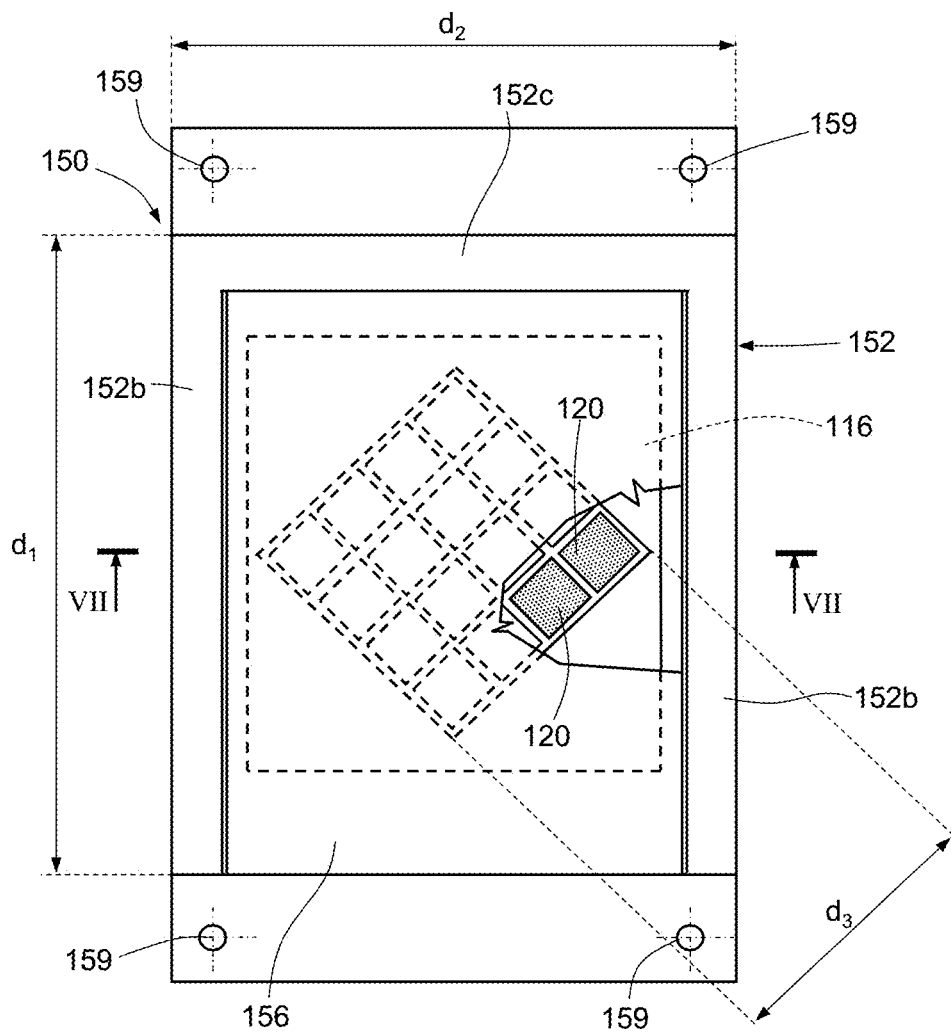
FIGS. 7A and 7B are, respectively, a view from above and a cross-sectional view from the side of the support and containment module of FIG. 6.
Figure 7B:
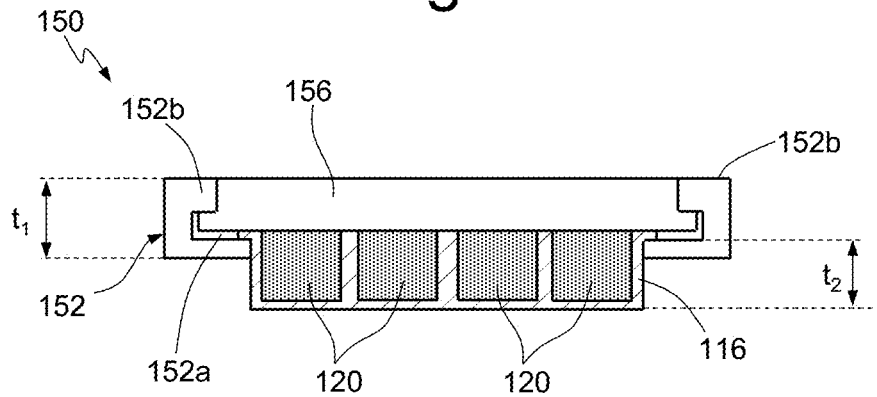

FIG. 7A shows, in a top view, the support module 150 with the housing 116 inserted, magnets 120 arranged inside each respective seat 118, and the slide 156 in the fully closed position. FIG. 7B is a view in vertical cross-section of the support module 150, taken along the cross-section line VII-VII of FIG. 7A.

Purely by way of example and in a non-limiting manner of the present disclosure, a few dimensions of the support module 150 and of the housing 116 of FIG. 7A and FIG. 7B are now provided.

In particular, the length $d_1$ of the longer side 152b of the frame structure 152 is between about 6 cm and 10 cm; the length d2 of the shorter top side 152c of the frame structure 152 is between 3 cm and 6 cm; the length $d_3$ of the matrix formed by the four seats 118 (having a value less than or equal to the through-openings 158 and 114) is between about 2 and 3 cm. In this case, each seat 118, of quadrangular shape, has a base side between 4.2 and 5.2 mm, to house cubic magnets having base sides measuring between 4 mm and 5 mm. With reference to FIG. 7B, the depth $t_1$ of the support module 150 is between 5 and 10 cm, while the seats 118 protrude from the frame portion 116a of the housing 116 for a value $t_2$ of between 4 and 5 mm.

The support module 150, the housing 116 and the slide 156 are produced from non-magnetic material, for example plastic material. Depending on the environment in which they are used, it is possible to choose the most suitable material, for example as a function of how such a material withstands high temperatures.

FIG. 8 is an exploded view which illustrates the support module 150 of FIG. 7A during mechanical coupling with a probe card 106 by means of screws 162. As is noted from FIG. 8, the probe card 106 exhibits, at one of its top faces 106', the through-opening 114 described previously, suitable for allowing the insertion of the seats 118 of the housing 116 borne by the support module 150 described previously. The probe card 106 is illustrated, in FIG. 8, in a view from above; the probe tips 108 are in the bottom part (not visible in the figure) of the probe card 106.

According to one embodiment of the present disclosure, the probe card 106, the housing 116 and the support module 150 are between them coupled in such a way that the magnets housed in the seats 118 generate, at the MEMS device 10 under test (in this particular case, the micromirror of FIG. 1), a magnetic field inclined at about 45° with respect to the axes A, B so as to make actuation possible on both the axes A, B. Thus, the test magnetic field $B_{test}$ generated is completely analogous to the magnetic field B generated, when in use, by the magnetic element 80 of FIGS. 2 and 3.

It is clear that, for testing devices of various types, the orientation of the test magnetic field $B_{test}$, as well as the mutual spatial arrangement of the probe card 106, the housing 116 and the support module 150, can be different and chosen according to need.

The embodiment of FIG. 6 provides for the use of a support module 150 provided with a bottom surface 152a, the thickness of which contributes to increasing the distance between the magnets 120 and the device under test 10, thus reducing the intensity of the magnetic field present at the level of the device under test 10.

To overcome this possible drawback, the support module can be without the bottom surface, as illustrated in FIG. 9. The support module 151 of FIG. 9 is similar to the support module 150 (common elements are indicated with the same reference numbers and not described further). However, the support module 151 is without the bottom surface and, as such, is mounted and fixed on the probe card 106 before the housing 116 is inserted. Thus, the housing 116 bears directly on the face 106' of the probe card 106. Such a support module 151, without the bottom surface, has the function of supporting and maintaining in position the slide 156 which functions, as already explained, as a protective cover for the magnets 120, preventing them from coming out of the respective seats.

However, the fact that the support module 151 is without the bottom surface means that it must be mounted on the probe card 106 before the magnets 120 are inserted and before the slide 156 is fully closed. This can create drawbacks or be impractical during phases of replacing a housing 116 with a housing 116 of a different type (for example, a housing having a different number of seats 118). Indeed, to prevent the magnets 120 from coming out of their seats and falling into the test machine in which the probe card is fitted, the Applicant has verified that it is preferable to dismantle the entire probe card only to change the housing 116. The replacing of the housing 116 can thus take place in a safe environment, where the magnets are not lost. However, this operation causes a loss of time that is not irrelevant.

To overcome the abovementioned drawbacks, there is proposed according to the present disclosure, a further embodiment of a support module and of a housing for the magnets 120.

Figure 10A:
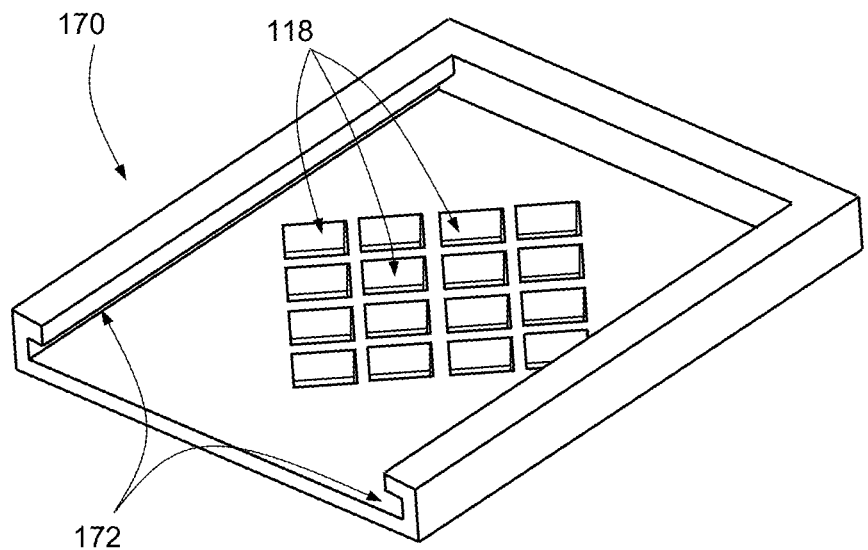
FIGS. 10A and 10B illustrate a magnet housing structure according to a further embodiment of the present disclosure.

FIG. 10A shows, in particular, a housing 170 provided with seats 118 similar to that described with reference to the housing 116, and as such identified with the same reference number. In particular, the seats 118 can be organized according to any one of the previously described configurations, for example with reference to FIGS. 5A-5D, or according to other patterns and layouts.

The housing 170 differs from the housing 116 due to the presence of guides 172 extending on opposite sides of the housing 170, and defining a route for the insertion of a slide 174 (illustrated in FIG. 10B) similar to the slide 156 described previously. The guides 172 are molded in a manner similar to the guides 154 described previously and define a stable seat for the slide 174, so that, when in use, this slide 174 does not come out of the guides 172.

Figure 10B:
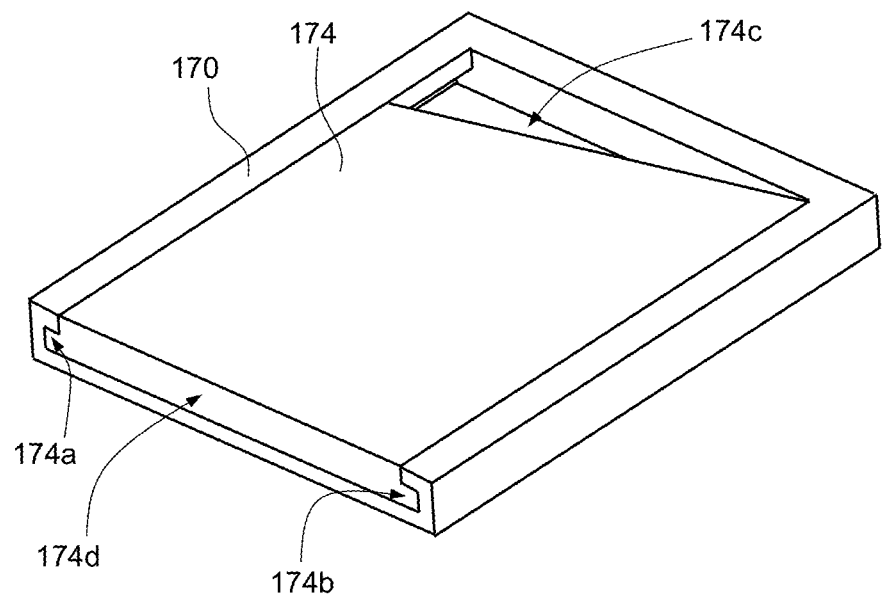

FIG. 10B illustrates the housing 170 provided with the slide 174. The insertion and removal of the slide 174 takes place by sliding the latter in the guides 172 in one direction and in the opposite direction respectively.

As noted from FIG. 10B, the slide 174 has, in one embodiment, a quadrangular shape, with two longer sides 174a, 174b parallel to each other, suitable for being inserted in the guides 172 and defining respective seats for the slide 174; and one shorter side 174c which is not parallel to the opposite side 174d. In particular, this configuration is obtained by making the side 174a have a shorter length than the side 174b. The side 174c is the side by which the slide 174 is first inserted in the seats of the guides 172. Thus, when the magnets 120 are being inserted in the seats 118, the slide 174 is at the same time made to slide in the guides 172 covering in succession the seats 118 one at a time, even in the case of a matrix configuration oriented as in FIGS. 10A, 10B, i.e. to generate a field inclined by 45° with respect to the axes A, B of the micromirror under test (according to the respective embodiment described previously).

Optionally, to facilitate the sliding of the slide 174, for the case in which its opening and closure is performed manually by an operator, it is possible to produce appropriate grooves/depressions/bumps on the slide 174, in a manner not shown in the figure.

The housing 170, equipped with the slide 174, can therefore be inserted in the support module 151 described previously (i.e. in the frame structure 152 closed from the top by means of the slide 156), without the bottom surface, and mechanically coupled to the probe card 106.

Since the housing 170, with the slide 174, forms a separate modular element, it can be inserted and removed from the support module 151 according to need, even when the support module 151 is fitted on the probe card 106. In particular, in this case, it is not necessary to remove the probe card 106 beforehand since the magnets 120 are prevented from coming out by the presence of the slide 174.

It is clear that, if desired, the housing 170 with the slide 174 can also be inserted in the support module 150 of FIG. 6.

Lastly, it is clear that modifications and variants can be brought to the invention described and illustrated here, without thereby departing from the scope of protection of the present invention, which scope is defined in the accompanying claims.

For example, the magnets described according to the various embodiments (e.g. magnets 120, or magnets 120a-120d, etc.) can be fixed in the respective housings by means of a layer of glue or of another adhesive material formed in the respective seats 118. Thus, the drawback relating to the disorderly displacement of the magnets when the slide 156 is being removed from the, or is being inserted in the, frame structure 152 is overcome.

Furthermore, it is clear that the shapes and dimensions described with reference to the support module 150, the slide 156, the housing 116 and the seats 118 can be modified according to need and in a manner that is obvious per se. Similarly, even the embodiment of the housing 170 can be modified in an obvious way by modifying the shape of the housing 170 and/or of the slide 174.

Furthermore, the seats 118 organized in vectors or matrices can be different in number from that illustrated in FIGS. 5A-5D; for example they can be organized to form a 3×3 matrix (for a total of nine seats 118), or a 5×5 matrix (for a total of 25 seats 118), and so on.

The invention described above, in the various embodiments, is applicable also to MEMS devices that are different from micromirrors, for example generic MEMS devices provided with an electromagnetically-operable suspended structure. Furthermore, the invention according to the present disclosure can be used for testing devices without suspended structures, but which require a magnetic field during the test phases (for example, in the case of magnetometers).

The invention claimed is:

1. A probe card for use in a system for testing a magnetically-actuable device, comprising:
  an integrated circuit board having a first through-opening at probe tips of said probe card;
  a housing structure including a planar region which surrounds at least one seat protruding from the planar region and extending at least partly through the first through-opening; and
  a permanent magnet arranged in each seat of the housing structure, the included permanent magnets configured to generate a test magnetic field for magnetically actuating the magnetically-actuable device during a test phase of the magnetically-actuable device.

2. The probe card according to claim 1, wherein said at least one seat comprises at least three seats, wherein the at least three seats extend one next to each other, and wherein each seat houses a respective permanent magnet, the included permanent magnets being mutually arranged so as to generate a magnetic field having a first intensity in a direction of the magnetically-actuable device and a second intensity, lower than the first intensity, in an opposite direction.

3. The probe card according to claim 2, wherein said included permanent magnets are mutually arranged to form a Halbach array.

4. The probe card according to claim 1, further comprising a cover of ferromagnetic material arranged on the at least one seat and on the permanent magnet within said at least one seat.

5. The probe card according to claim 1, further comprising:
  a cover of non-magnetic material arranged on said at least one seat and on the permanent magnet within said at least one seat; and
  a shielding layer, of μ-metal, extending above the cover.

6. The probe card according to claim 1, wherein the housing structure includes:
  second guides which protrude from said planar region in a direction opposite to the direction in which said at least one seat extends; and
  a second slide configured to slide in said second guides so as to cover and, alternatively, uncover said at least one seat.

7. The probe card according to claim 6, wherein said at least one seat comprises at least nine seats mutually arranged one next to another to form a 3×3 matrix structure, said second slide being molded in such a way as to cover, during the closure operation, each of said at least nine seats one at a time.

8. The probe card according to claim 1, wherein said magnetically-actuable device includes a magnetically-actuable suspended structure that is movable about a first and a second axis of rotation, and wherein the at least one seat is a plurality of seats, said magnetically-actuable device, said integrated circuit board and said housing structure being mutually arranged in such a way that the test magnetic field is oriented at around 45° with respect to the first and second axes of rotation of the suspended structure of the magnetically-actuable device.

9. A probe card for use in a system for testing a magnetically-actuable device, comprising:
an integrated circuit board having a first through-opening at probe tips of said probe card;
a housing structure including a planar region which surrounds at least one seat protruding from the planar region and extending at least partly through the first through-opening;
a magnetic element arranged in each seat of the housing structure, the included magnetic elements configured to generate a test magnetic field for magnetically actuating the magnetically-actuable device during a test phase of the magnetically-actuable device;
a support structure having a second through-opening and side walls surrounding at least in part said second through-opening, the side walls being provided with respective first guides; and
a first slide configured to slide in said first guides,
wherein said at least one seat extends through the second through-opening.

10. The probe card according to claim 9, wherein the support structure has a bottom side surrounded by the side walls, and wherein the planar region of the housing structure is extended between the bottom side and the first slide, the second through-opening being extended through the bottom side.

11. The probe card according to claim 9, wherein said first guides are formed by respective recesses in the side walls, said first slide having tapered peripheral regions configured to slide in said recesses.

12. The probe card according to claim 9, wherein said at least one seat comprises at least three seats, wherein the at least three seats extend one next to each other, and wherein each seat houses a respective magnetic element, the included magnetic elements being mutually arranged so as to generate a magnetic field having a first intensity in a direction of the magnetically-actuable device and a second intensity, lower than the first intensity, in an opposite direction.

13. The probe card according to claim 12, wherein said included magnetic elements are mutually arranged to form a Halbach array.

14. The probe card according to claim 9, further comprising a cover of ferromagnetic material arranged on the at least one seat and on the magnetic element within said at least one seat.

15. The probe card according to claim 9, further comprising:
a cover of non-magnetic material arranged on said at least one seat and on the magnetic element within said at least one seat; and
a shielding layer, of μ-metal, extending above the cover.

16. The probe card according to claim 9, wherein said magnetically-actuable device includes a magnetically-actuable suspended structure that is movable about a first and a second axis of rotation, and wherein the at least one seat is a plurality of seats, said magnetically-actuable device, said integrated circuit board and said housing structure being mutually arranged in such a way that the test magnetic field is oriented at around 45° with respect to the first and second axes of rotation of the suspended structure of the magnetically-actuable device.

17. A test system, comprising:
a chuck configured to support a wafer of semiconductor material including a magnetically-actuable device,
a probe card;
a wafer prober mechanically coupled to the probe card, configured to move the chuck in order to electrically couple selective portions of said magnetically-actuable device with respective probe tips of the probe card; and
a data processing circuit electrically coupled to the probe card, configured to feed electrical test signals to the magnetically-actuable device by means of the probe card and to process response signals received, via the probe card, from the device during the magnetic actuation of the magnetically-actuable device;
wherein the probe card comprises:
an integrated circuit board having a first through-opening at probe tips of said probe card;
a housing structure, including a planar region which surrounds at least one seat protruding from the planar region and extending at least partly through the first through-opening; and
a permanent magnet included within each seat, the included permanent magnets configured to generate a test magnetic field for magnetically actuating the magnetically-actuable device during a test phase of the magnetically-actuable device.

18. The test system according to claim 17, wherein the probe card is spatially arranged between the wafer and the data processing circuit.

19. A probe card for use in a system for testing a magnetically-actuable device, comprising:
an integrated circuit board having a through-opening extending between a first surface and a second surface;
probe tips extending from a first surface of the integrated circuit board and configured to make electrical connection with pads of the magnetically-actuable device;
a housing structure including a portion inserted the through-opening from the second surface, said portion of the housing structure including a plurality of seats; and
a plurality of permanent magnets, each permanent magnet arranged in a respective seat of the housing structure, the plurality of permanent magnets oriented in said seats to generate a magnetic field having a first intensity in a direction of the magnetically-actuable device and a second intensity, lower than the first intensity, in an opposite direction, said magnetic field configured to magnetically actuate the magnetically-actuable device during a test phase of the magnetically-actuable device.

20. The probe card according to claim 19, wherein said plurality of permanent magnets are mutually arranged to form a Halbach array.

* * * * *